US012796343B2

(12) United States Patent
Park et al.

(10) Patent No.: US 12,796,343 B2
(45) Date of Patent: Nov. 10, 2026

(54) VARIABLE RESISTANCE MATERIAL AND VARIABLE RESISTANCE MEMORY DEVICE INCLUDING THE SAME

(71) Applicant: SAMSUNG ELECTRONICS CO., LTD., Suwon-si (KR)

(72) Inventors: Changyup Park, Suwon-si (KR); Young Jae Kang, Suwon-si (KR); Donggeon Gu, Suwon-si (KR); Bonwon Koo, Suwon-si (KR); Segab Kwon, Suwon-si (KR); Dongho Ahn, Suwon-si (KR); Changseung Lee, Suwon-si (KR); Yongnam Ham, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 311 days.

(21) Appl. No.: 18/753,575

(22) Filed: Jun. 25, 2024

(65) Prior Publication Data

US 2025/0107461 A1 Mar. 27, 2025

(30) Foreign Application Priority Data

Sep. 25, 2023 (KR) ........................ 10-2023-0128369

(51) Int. Cl.

*H10N 70/00* (2023.01)
*C22C 30/00* (2006.01)
*H10B 63/00* (2023.01)

(52) U.S. Cl.

CPC ......... *H10N 70/8828* (2023.02); *C22C 30/00* (2013.01); *H10B 63/24* (2023.02)

(58) Field of Classification Search

CPC ............................ H10N 70/8828; H10B 63/24
See application file for complete search history.

(56) References Cited

U.S. PATENT DOCUMENTS

| | | | |
|---|---|---|---|
| 8,268,433 | B2 | 9/2012 | Tsuchino et al. |
| 9,543,513 | B2 | 1/2017 | Kim et al. |
| 10,050,196 | B1 | 8/2018 | Cheng et al. |
| 2022/0195583 | A1 | 6/2022 | Hayashi et al. |

*Primary Examiner* — Samuel A Gebremariam
(74) *Attorney, Agent, or Firm* — Sughrue Mion, PLLC

(57) ABSTRACT

Provided are variable resistance materials and a variable resistance memory devices including the same. The variable resistance memory device includes: a first electrode; a first variable resistance material on the first electrode; and a second electrode on the first variable resistance material. The first variable resistance material includes germanium, antimony, tellurium, carbon, and sulfur and is expressed by $C_pS_qGe_xSb_yTe_z$, where p is an atomic concentration of carbon, q is an atomic concentration of sulfur, x is an atomic concentration of germanium, y is an atomic concentration of antimony, and z is an atomic concentration of tellurium, wherein a sum of p, q, x, y, and z equals 1, wherein each of p, q, x, y, and z is greater than zero, and wherein q is greater than 0.01 and is less than or equal to about 0.2.

20 Claims, 8 Drawing Sheets

VARIABLE RESISTANCE MATERIAL AND VARIABLE RESISTANCE MEMORY DEVICE INCLUDING THE SAME

CROSS-REFERENCE TO RELATED APPLICATION

This U.S. nonprovisional application is based on and claims priority to Korean Patent Application No. 10-2023-0128369, filed on Sep. 25, 2023, in the Korean Intellectual Property Office, the disclosure of which is hereby incorporated by reference in its entirety.

BACKGROUND

1. Field

The disclosure relates to a semiconductor memory device, and more particularly, to a variable resistance material and a variable resistance memory device including the same.

2. Description of Related Art

In general, semiconductor memory devices can be broadly classified into volatile memory devices and non-volatile memory devices. The volatile memory devices, such as dynamic random access memory (DRAM) and static random access memory (SRAM), lose stored data when their power supply is interrupted. The nonvolatile memory devices, such as programmable ROM (PROM), erasable PROM (EPROM), electrically erasable PROM (EEPROM), and Flash memory device, do not lose stored data even when their power supply is inhibited.

Next generation semiconductor memory devices, for example, MRAM (magnetic random access memory) and PRAM (phase change random access memory), are being developed to meet the trend of high performance and low power of the semiconductor memory devices. The next generation semiconductor memory devices include a material having a characteristic wherein their resistance changes depending on applied electric current or voltage and their resistance is maintained even when their electric current or voltage supply is interrupted.

A phase change memory (PRAM) includes a phase change material therein. The phase change material is present in a crystalline or amorphous state in the device, and magnitude and time of current provided through a bit line may be controlled to adjust the phase of the phase change material. The phase change material in the crystalline state may have an electrical resistance greater than that of the phase change material in the amorphous state.

SUMMARY

Provided are a variable resistance material whose power consumption and read properties are improved by designing a composition ratio of the variable resistance material, and a variable resistance memory device including the same.

According to an aspect of the disclosure, a variable resistance memory device includes: a first electrode; a first variable resistance material on the first electrode; and a second electrode on the first variable resistance material, wherein the first variable resistance material includes germanium (Ge), antimony (Sb), tellurium (Te), carbon (C), and sulfur (S), wherein the first variable resistance material is expressed by $C_pS_qGe_xSb_yTe_z$, where p is an atomic concentration of carbon (C) in the first variable resistance material, q is an atomic concentration of sulfur (S) in the first variable resistance material, x is an atomic concentration of germanium (Ge) in the first variable resistance material, y is an atomic concentration of antimony (Sb) in the first variable resistance material, and z is an atomic concentration of tellurium (Te) in the first variable resistance material, wherein a sum of p, q, x, y, and z equals 1, wherein each of p, q, x, y, and z is greater than zero, and wherein q is greater than 0.01 and is less than or equal to about 0.2.

According to an aspect of the disclosure, a variable resistance material includes: germanium (Ge); antimony (Sb); tellurium (Te); carbon (C); and sulfur (S), wherein the variable resistance material is expressed by $C_pS_qGe_xSb_yTe_z$, where p is an atomic concentration of carbon (C) in the variable resistance material, q is an atomic concentration of sulfur (S) in the variable resistance material, x is an atomic concentration of germanium (Ge) in the variable resistance material, y is an atomic concentration of antimony (Sb) in the variable resistance material, and z is an atomic concentration of tellurium (Te) in the variable resistance material, wherein a sum of p, q, x, y, and z equals 1, wherein each of p, q, x, y, and z is greater than zero, and wherein q is greater than 0.01 and is less than or equal to about 0.2.

According to an aspect of the disclosure, a variable resistance memory device includes: a first electrode; a first variable resistance material on the first electrode; a second electrode on the first variable resistance material; a selection element between the first electrode and the first variable resistance material; and a third electrode between the selection element and the first variable resistance material, wherein the first variable resistance material includes germanium (Ge), antimony (Sb), tellurium (Te), and sulfur (S), wherein the first variable resistance material is expressed by $S_qGe_xSb_yTe_z$, where q is an atomic concentration of sulfur (S) in the first variable resistance material, x is an atomic concentration of germanium (Ge) in the first variable resistance material, y is an atomic concentration of antimony (Sb) in the first variable resistance material, and z is an atomic concentration of tellurium (Te) in the first variable resistance material, wherein a sum of q, x, y, and z is less than 1, wherein each of q, x, y, and z is greater than zero, and wherein q is greater than 0.01 and is less than or equal to about 0.2.

BRIEF DESCRIPTION OF DRAWINGS

The above and other aspects, features, and advantages of certain embodiments of the disclosure will be more apparent from the following description taken in conjunction with the accompanying drawings, in which.

DETAILED DESCRIPTION

Figure 1:
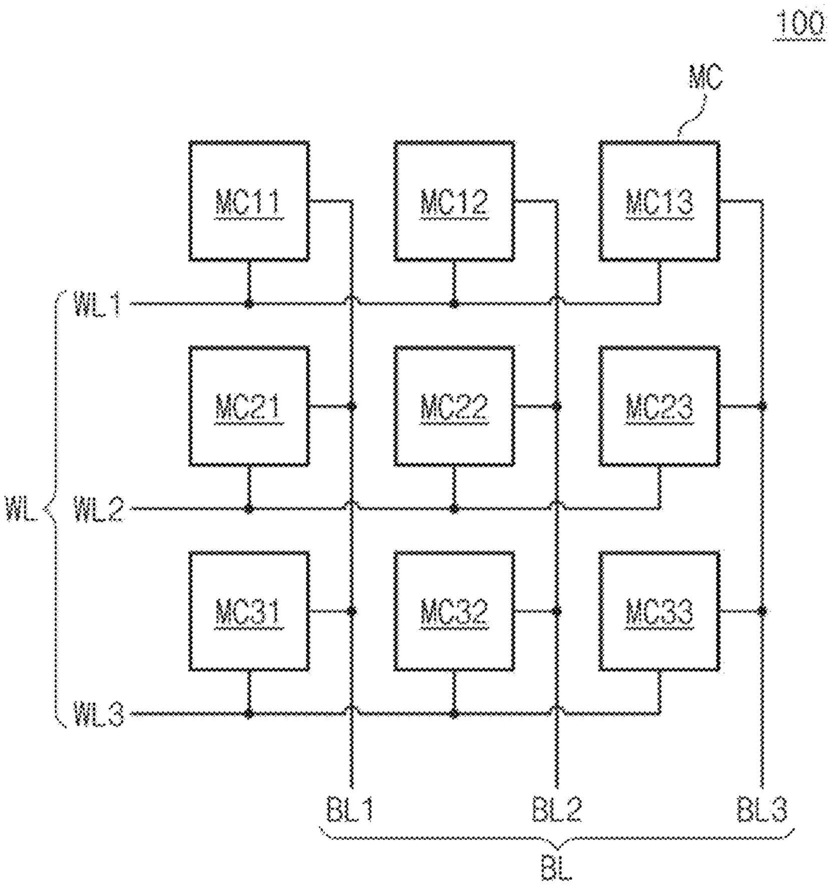
FIG. 1 is a circuit diagram illustrating a memory cell array of a variable resistance memory device according to one or more embodiments of the disclosure.

One or more embodiments of the disclosure will now be described in detail with reference to the accompanying drawings.

In the following description, like reference numerals refer to like elements throughout the specification. As used herein, a plurality of "unit", "module", "member", and "block" may be implemented as a single component or a single "unit", "module", "member", and "block" may include a plurality of components.

It will be understood that when an element is referred to as being "connected" with or to another element, it can be directly or indirectly connected to the other element.

Also, when a part "includes" or "comprises" an element, unless there is a particular description contrary thereto, the part may further include other elements, not excluding the other elements.

Throughout the description, when a member is "on" another member, this includes not only when the member is in contact with the other member, but also when there is another member between the two members.

Herein, the expressions "at least one of a, b or c" and "at least one of a, b and c" indicate "only a," "only b," "only c," "both a and b," "both a and c," "both b and c," and "all of a, b, and c."

It will be understood that, although the terms first, second, third, etc., may be used herein to describe various elements, is the disclosure should not be limited by these terms. These terms are only used to distinguish one element from another element.

As used herein, the singular forms "a," "an" and "the" are intended to include the plural forms as well, unless the context clearly indicates otherwise.

With regard to any methods or operations described herein, an identification code may used for the convenience of the description but is not intended to illustrate the order of each step. Each step or operation may be implemented in an order different from the illustrated order unless the context clearly indicates otherwise.

Figure 2:
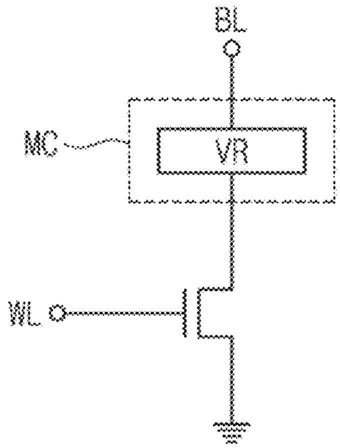
FIG. 2 is a circuit diagram illustrating a circuit of one of the memory cells depicted in FIG. 1.

FIG. 1 is a circuit diagram showing a memory cell array of a variable resistance memory device according to one or more embodiments of the disclosure. FIG. 2 is a circuit diagram showing a circuit of one of the memory cells depicted in FIG. 1.

Referring to FIGS. 1 and 2, a variable resistance memory device may include a variable resistance memory cell array 100. The variable resistance memory cell array 100 may include a plurality of variable resistance memory cells MC. For example, the variable resistance memory cell array 100 may include nine variable resistance memory cells MC11 to MC33 that are arrayed in a 3×3 arrangement. This, however, is provided for convenience of description, and the number and arrangement of the variable resistance memory cells MC may be variously changed.

The variable resistance memory cell array 100 may include a plurality of word lines WL and a plurality of bit lines BL. For example, the plurality of word lines WL may include first, second, and third word lines WL1, WL2, and WL3. The plurality of bit lines BL may include first, second, and third bit lines BL1, BL2, and BL3. Each of the variable resistance memory cells MC may be connected to a corresponding word line WL and a corresponding bit line BL. For example, one variable resistance memory cell MC22 may be connected to the second word line WL2 and the second bit line BL2.

Each of the variable resistance memory cells MC may include a variable resistance material VR. For example, the variable resistance material VR may be a phase change material (PCM). The phase change material may have one of a crystalline state and an amorphous state. The phase change material in the crystalline state may have a threshold voltage less than the threshold voltage of the phase change material in the amorphous state.

The phase change material may have a high resistance state (HRS) which corresponds to the amorphous state. When the phase change material is in the high resistance state, a phase change memory cell may have data of "0". The phase change material may have a low resistance state (LRS) which corresponds to the crystalline state. When the phase change material is in the low resistance state, a phase change memory cell may have data of "1". A reset operation may be defined to indicate a series of operations to allow a phase change memory cell to have data of "0" (for example, to allow the phase change material to have or enter the amorphous state). A set operation may be defined to indicate a series of operations to allow a phase change memory cell to have data of "1" (for example, to allow the phase change material to have or enter the crystalline state).

According to one or more embodiments of the disclosure, the variable resistance material VR may include germanium (Ge), antimony (Sb), tellurium (Te), carbon (C), and sulfur (S). The variable resistance material VR may be expressed by $C_pS_qGe_xSb_yTe_z$, where the subscript x may be an atomic concentration of germanium (Ge), the subscript y may be an atomic concentration of antimony (Sb), the subscript z may be an atomic concentration of tellurium (Te), the subscript p may be an atomic concentration of carbon (C), and the subscript q may be an atomic concentration of sulfur (S). The expression "atomic concentration" as used herein may be defined to indicate a value obtained by dividing the number of total atoms into the number of specific atoms included in the variable resistance material VR. Each of germanium (Ge), antimony (Sb), tellurium (Te), carbon (C), and sulfur (S) may have an atomic concentration of greater than about zero, and a sum of the atomic concentrations may be equal to or less than about 1. For example, a sum of x, y, z, p, and q may be equal to or less than about 1.

For example, the variable resistance material VR may be a material expressed by $Ge_2Sb_2Te_5$ (referred to hereinafter as GST225) doped with carbon (C) and sulfur (S), and in this case, x:y:z in $C_pS_qGe_xSb_yTe_z$ may be substantially 2:2:5. For example, the atomic concentration x of germanium (GE) of the variable resistance material VR may range from about 0.15 to about 0.25 ($0.15 \leq x \leq 0.25$), the atomic concentration z of tellurium (Te) may range from about 0.4 to about 0.55 ($0.4 \leq z \leq 0.55$), the atomic concentration p of carbon (C) may range from greater than about 0.03 to about 0.2 ($0.03 < p \leq 0.2$), the atomic concentration q of sulfur (S) may range from greater than about 0.01 to about 0.2 ($0.01 < q \leq 0.2$), and the atomic concentration y of antimony (Sb) may range from greater than about 0 and $1-(x+z+p+q)$.

When the variable resistance material VR has the composition discussed above, the variable resistance material VR may increase in reset current and sensing margin which will be discussed below, and accordingly, the variable resistance memory device may have improved power consumption and read properties.

Various methods may be used to form carbon (C) and sulfur (S) in the variable resistance material VR. For example, a physical vapor deposition (PVD) process may be employed to form carbon (C) and sulfur (S) in the variable resistance material VR. A plurality of source materials may be used to perform the PVD process. For example, the plurality of source materials may include a first source material including germanium (Ge), antimony (Sb), and tellurium (Te), a second source material including carbon (C), and a third source material including sulfur (S), and the plurality of source materials may be simultaneously sputtered to form the variable resistance material VR on a substrate. For another example, a single source material may be used to perform the PVD process. For example, the single source material may be a material including carbon (C), sulfur (S), germanium (Ge), antimony (Sb), and tellurium (Te), and the single source material may be sputtered to form the variable resistance material VR on a substrate. This, however, is exemplary, and the PVD process may be performed by various methods that can be modified by those skilled in the art.

For example, a precursor including carbon (C) and a precursor including sulfur (S) may be used to perform a chemical vapor deposition (CVD) process or an atomic vapor deposition (AVD) process to form carbon (C) and sulfur (S) in the variable resistance material VR. For example, an ion implantation process (IMP) may be employed to implant carbon (C) and sulfur (S) into the variable resistance material VR.

Figure 3:
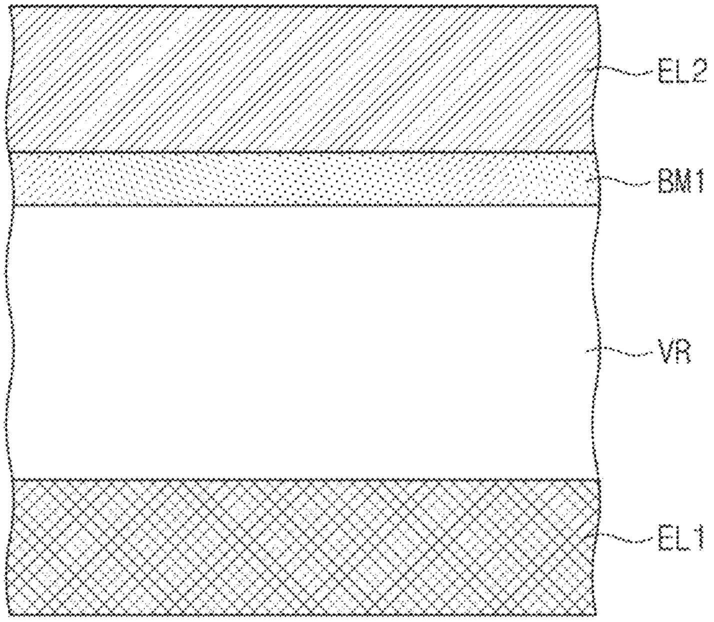
FIG. 3 is a cross-sectional view of a memory cell of a variable resistance memory device according to one or more embodiments of the disclosure.

FIG. 3 is a cross-sectional view showing a memory cell of a variable resistance memory device according to one or more embodiments of the disclosure.

Referring to FIG. 3, a variable resistance memory device may include a first electrode EL1, a variable resistance material VR, a first barrier pattern BM1, and a second electrode EL2. The variable resistance material VR may be interposed between the first electrode EL1 and the second electrode EL2. The first barrier pattern BM1 may be interposed between the variable resistance material VR and the second electrode EL2.

The first electrode EL1 may be provided on and controlled by the word line WL of FIG. 2. The second electrode EL2 may be provided on and controlled by the bit line BL of FIG. 2. The first electrode EL1 and the second electrode EL2 may each include a conductive material.

For example, the first barrier pattern BM1 may include metal nitride (e.g., a nitride of one or more of Ti, Mo, W, Cu, Al, Ta, Ru, Ir, and Co). The first barrier pattern BM1 may prevent diffusion of a material included in the variable resistance material VR.

Figure 4:
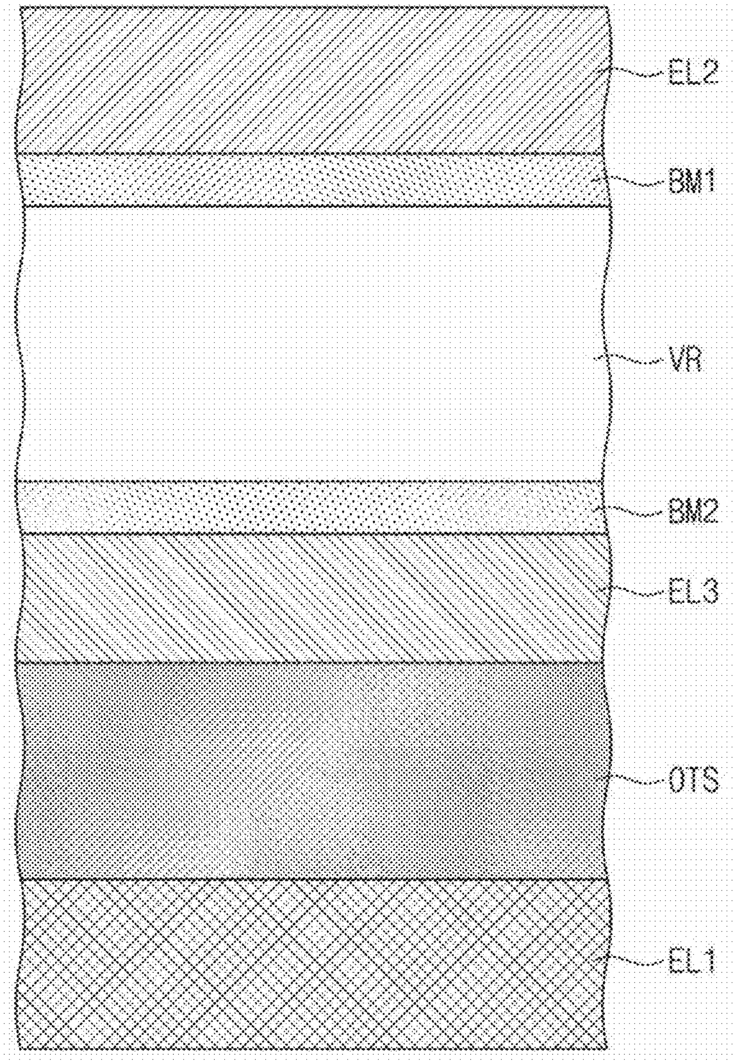
FIG. 4 is a cross-sectional view of a memory cell of a variable resistance memory device according to one or more embodiments of the disclosure.

FIG. 4 is a cross-sectional view of a memory cell of a variable resistance memory device according to one or more embodiments of the disclosure.

Referring to FIG. 4, a variable resistance memory device may include a first electrode EL1, a selection element OTS, a third electrode EL3, a second barrier pattern BM2, a variable resistance material VR, a first barrier pattern BM1, and a second electrode EL2. For brevity of description, a repetitive discussion of those discussed above will be omitted, and a difference thereof will be mainly explained.

The selection element OTS, the third electrode EL3, and the second barrier pattern BM2 may be interposed between the first electrode EL1 and the variable resistance material VR. For example, the selection element OTS, the third electrode EL3, and the second barrier pattern BM2 may be sequentially provided on the first electrode EL1.

The selection element OTS may be a diode or a device based on a threshold switching phenomenon having a nonlinear I-V curve (e.g., S-type I-V curve). For example, the selection element OTS may be an Ovonic threshold switch (OTS) having bi-directional characteristics.

In one or more embodiments, the Ovonic threshold switch may include at least one selected from GeSe, GeS, AsSe, AsTe, AsS SiTe, SiSe, SiS, GeAs, SiAs, SnSe, and SnTe. In one or more embodiments, the Ovonic threshold switch may include at least one selected from GeAsTe, GeAsSe, AlAsTe, AlAsSe, SiAsSe, SiAsTe, GeSeTe, GeSeSb, GaAsSe, GaAsTe, InAsSe, InAsTe, SnAsSe, and SnAsTe. In one or more embodiments, the Ovonic threshold switch may include at least one selected from GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, and GeAsTeZn.

In one or more embodiments, the Ovonic threshold switch may include at least one selected from GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, and GeAsSeZnSn.

In one or more embodiments, the Ovonic threshold switch may include at least one selected from GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, and GeAsSeZnSn.

The third electrode EL3 may be controlled by the selection element OTS. The third electrode EL3 may include a conductive material.

For example, the second barrier pattern BM2 may include metal nitride (e.g., a nitride of one or more of Ti, Mo, W, Cu, Al, Ta, Ru, Ir, and Co). The second barrier pattern BM2 may prevent diffusion of a material included in the variable resistance material VR. For example, the second barrier pattern BM2 may prevent a material of the variable resistance material VR from diffusing into the third electrode EL3.

The variable resistance material VR may be interposed between the second electrode EL2 and the third electrode EL3. The first barrier pattern BM1 may separate the variable resistance material VR from the second electrode EL2. The second barrier pattern BM2 may separate the variable resistance material VR from the third electrode EL3.

Figure 5A:
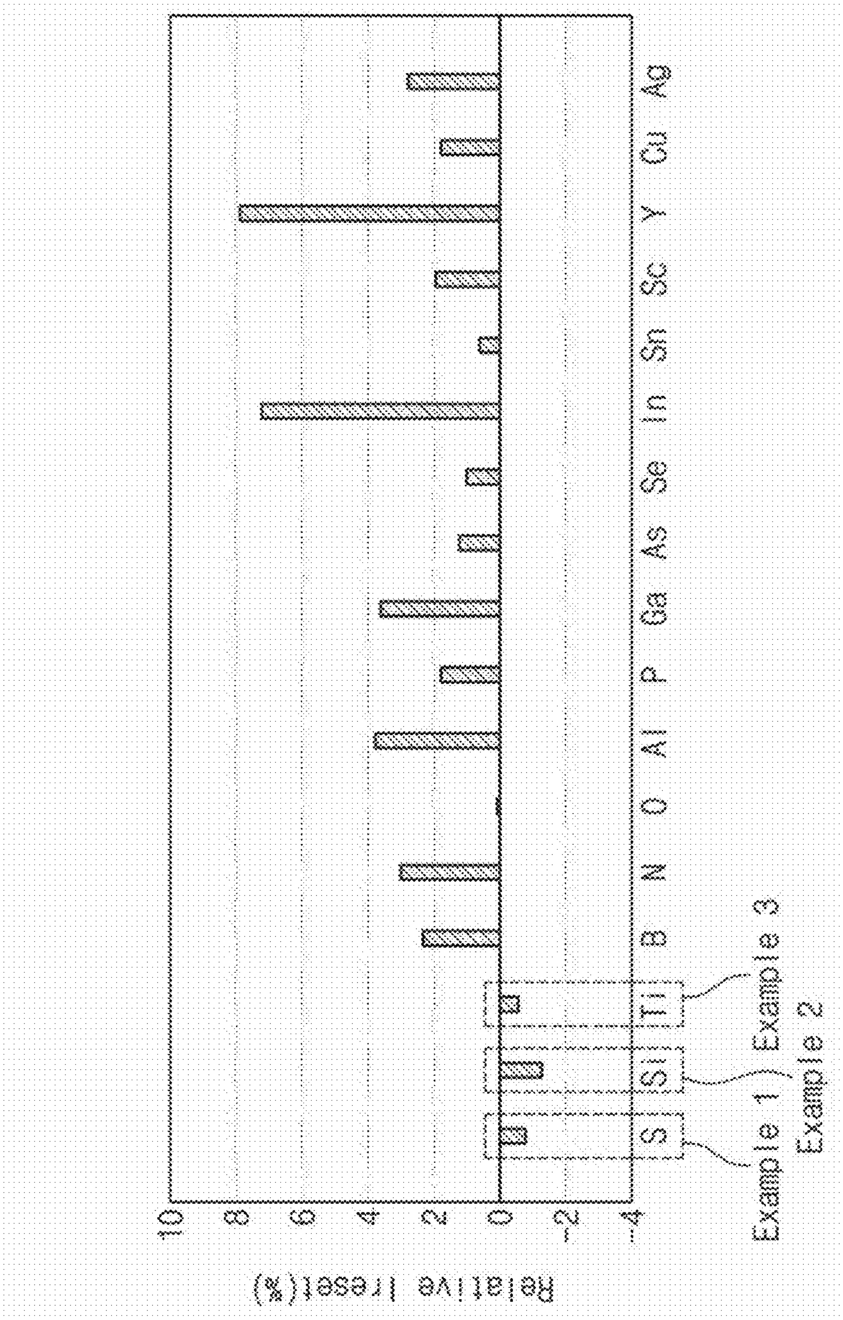
FIG. 5A is a graph showing a relative magnitude of a reset current in each of a variety of Examples with respect to a reset current of a reference material.
Figure 5B:
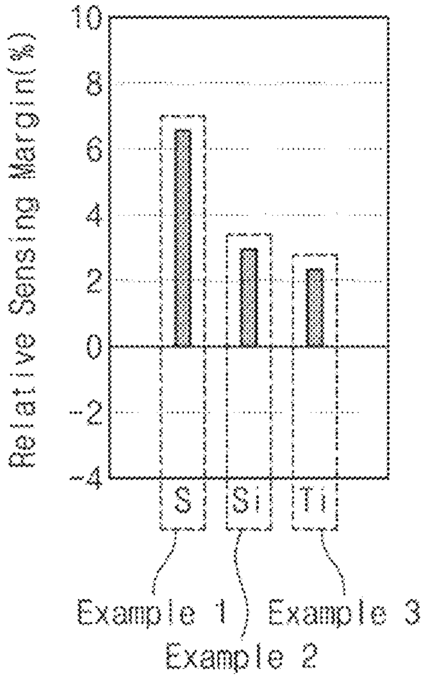
FIG. 5B is a graph showing a relative magnitude of a sensing margin in each of Example 1, Example 2, and Example 3 with respect to a sensing margin of a reference material.

With reference to FIGS. 5A and 5B, the following will describe results of experiments on magnitudes of reset current and sensing margin in accordance with changes in composition of the variable resistance material VR. In performing the present experiment, a material obtained by doping GST225 with carbon (C) is selected as a reference material, and a material obtained by doping the reference material with additional impurities is selected as Examples. In each of the Examples, an impurity concentration is 5%. For example, each of the Examples is a material obtained by doping the reference material with one or more of S, Si, Ti, B, N, O, Al, P, Ga, As, In, Sn, Sc, Y, Cu, and Ag. A material obtained by doping the reference material with sulfur (S) is defined as Example 1, a material obtained by doping the reference material with silicon (Si) is defined as Example 2, and a material obtained by doping the reference material as titanium (Ti) is defined as Example 3.

FIG. 5A illustrates a graph showing a relative magnitude of a reset current in each of the Examples with respect to a reset current of a reference material.

In the present experiment, the reset current is defined to indicate a current required for a reset operation. For example, the reset current is defined to indicate a current required for a series of operations to allow a phase change memory cell to have data of "0" (for example, to allow a variable resistance material to have or enter an amorphous state).

Referring to FIG. 5A, the reset current of each of the Examples may have a value different from that of the reset current of the reference material. The reset current of each of Example 1, Example 2, and Example 3 may have a value relatively less than that of the reset current of the reference material. by contrast, the reset current of the remaining Examples may have a value relatively greater than that of the reset current of the reference material. For example, a power consumption required for a reset operation may be less for Example 1, Example 2, and Example 3 than for the reference material. A power consumption required for a reset operation may be greater for the remaining Examples than for the reference material.

FIG. 5B is a graph showing a relative magnitude of a sensing margin in each of Example 1, Example 2, and Example 3 with respect to a sensing margin of a reference material.

In the present experiment, a sensing margin may be a margin for distinguishing a set state from a reset state during a read operation, and may be defined to indicate a value obtaining by subtracting a set threshold voltage from a reset threshold voltage. When the variable resistance material VR is in a set state, an applied voltage is increased and thus there appears to be a period where there is a rapid increase in current that flows through the variable resistance material VR. In the present experiment, in the set state, a set threshold voltage is defined to indicate a voltage that corresponds to a current in the period where there is a rapid increase in current. Likewise, when the variable resistance material VR is in a reset state, an applied voltage is increased and thus there appears a period where there is a rapid increase in current that flows through the variable resistance material VR. In the present experiment, in the reset state, a reset threshold voltage is defined to indicate a voltage that corresponds to a current in the period where there is a rapid increase in current.

When the variable resistance material VR is in the set state, if a read voltage is greater than the set threshold voltage, a relatively large current may flow through the variable resistance material VR. When the variable resistance material VR is in the reset state, if a read voltage is less than the set threshold voltage, a relatively small current may flow through the variable resistance material VR. This difference may distinguish a state of the variable resistance material VR into the set state and the reset state. An increase in difference between the reset threshold voltage and the set threshold voltage (or difference in sensing margin) may induce an increase in range of the read voltage capable of being applied. For example, an increase in sensing margin may facilitate an increased ability to distinguish between the set state and the reset state of the variable resistance material VR.

Referring to FIG. 5B, a sensing margin of each of Example 1, Example 2, and Example 3 may have a value greater than that of a sensing margin of the reference material. The sensing margin of each of Example 2 and Example 3 may be 4% or less greater than the sensing margin of the reference material, and the sensing margin of Example 1 may be 6% or less greater than the sensing margin of the reference material. For example, compared to sensing margin of the reference material, the sensing margin of each of Example 1, Example 2, and Example 3 may be greatly increased, and the sensing margin of Example 1 may be maximally increased.

Figure 7:
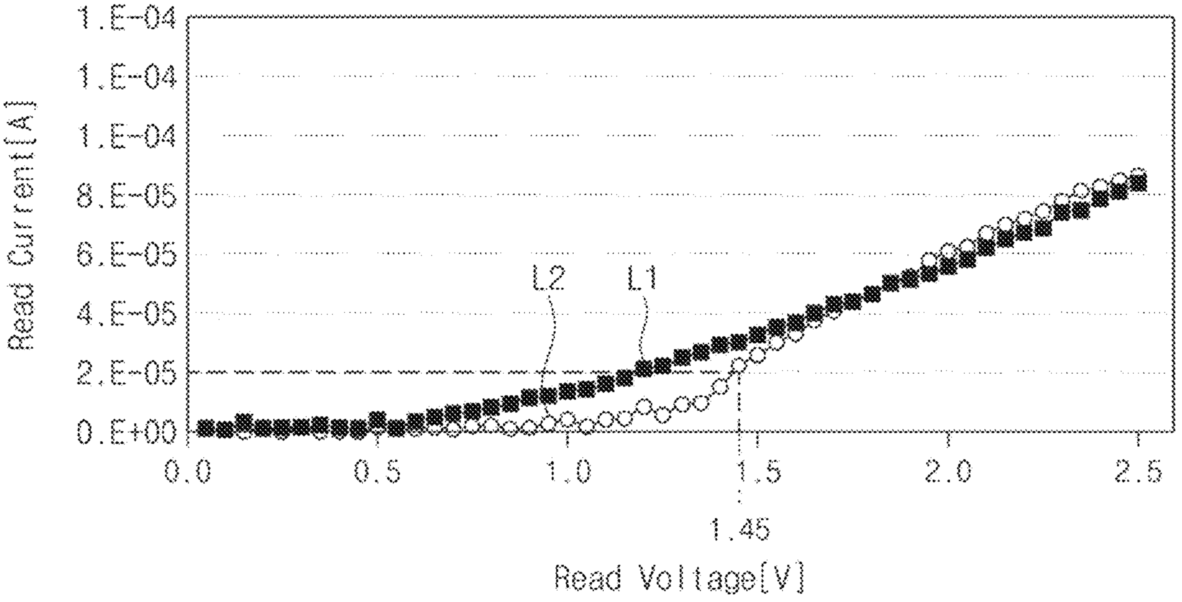
FIG. 7 is a graph showing an I-V graph of Example 6.
Figure 8:
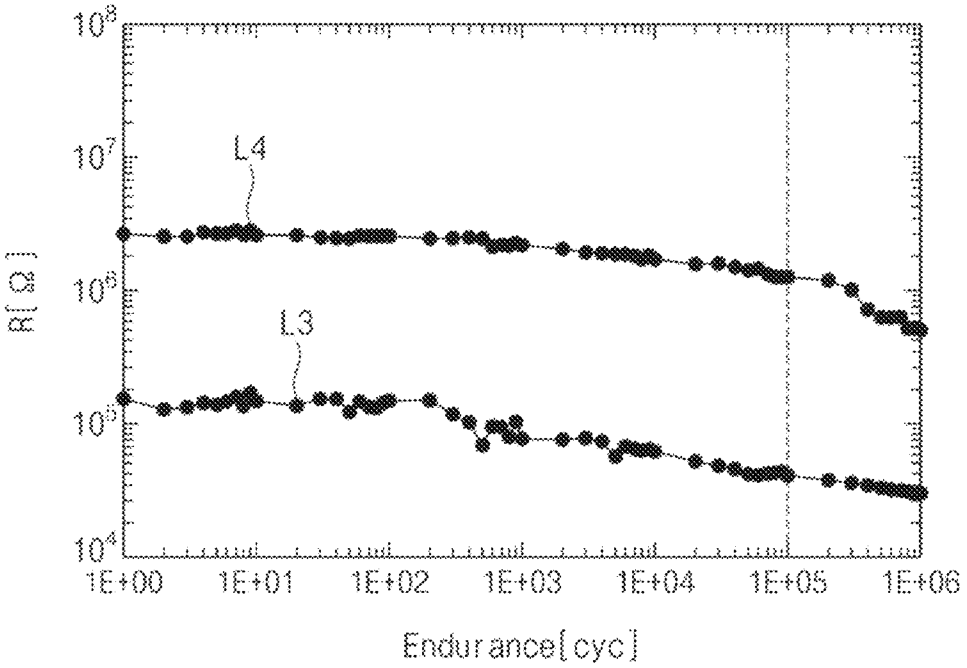
FIG. 8 is a graph showing a resistance of a variable resistance material in accordance with an operation cycle of Example 6.

With reference to FIGS. 7 to 9, the following will describe results of experiments on electrical properties of the variable resistance material VR in accordance with the concentration of carbon in the variable resistance material VR. In performing the present experiment, a material obtained by doping GST225 with sulfur and carbon is selected as Example 4, Example 5, Example 6, and Example 7. Example 4, Example 5, Example 6, and Example 7 have the same sulfur concentration of 6%. Example 4, Example 5, Example 6, and Example 7 have carbon concentrations of 6%, 9%, 12%, and 15%, respectively.

Figure 6:
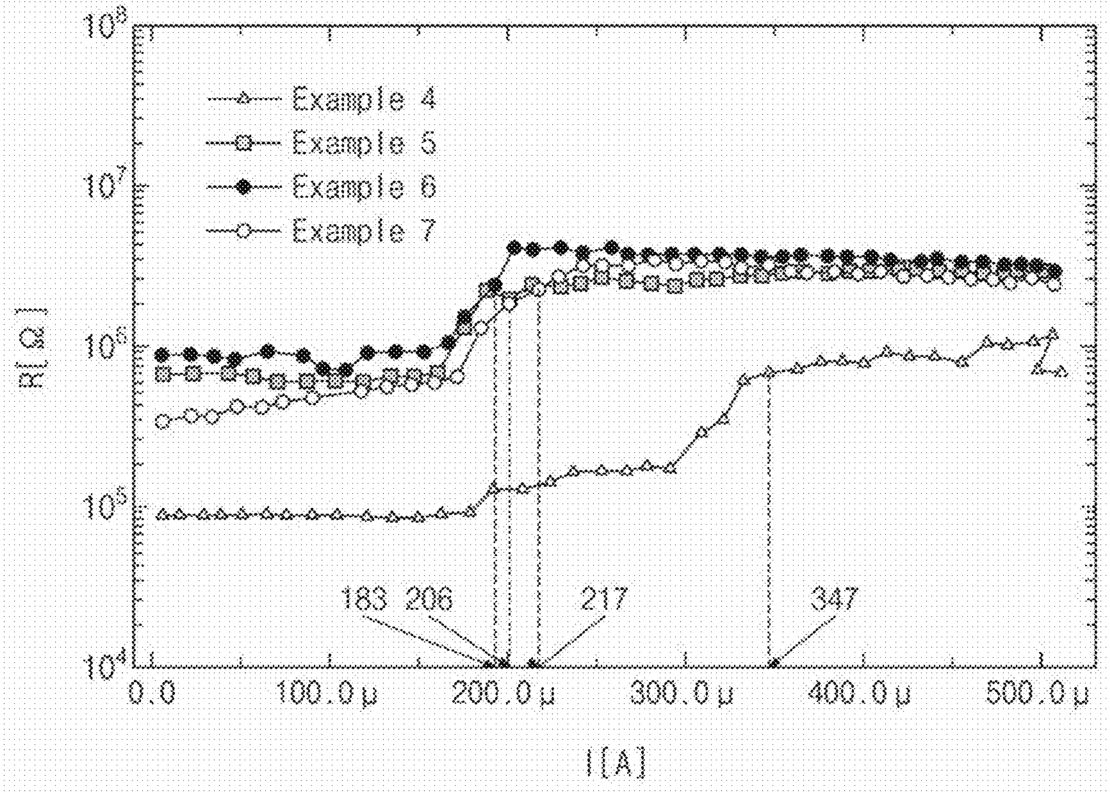
FIG. 6 is a graph showing a resistance of a variable resistance material in accordance with a current applied to a variable resistance material.

FIG. 6 is a graph showing a resistance of the variable resistance material VR in accordance with a current applied to the variable resistance material VR.

Referring to FIG. 6, the X axis denotes a current applied to the variable resistance material VR, and the Y axis denotes a resistance of the variable resistance material VR in accordance with the applied current. As a current is increased, there appears to be a period where there is a rapid increase in resistance of the variable resistance material VR, and then as the current further increases, there appears a period where there is a gradual change in resistance of the variable resistance material VR. In the period where there is a rapid increase in resistance, as the variable resistance material VR is changed from a crystalline phase into an amorphous phase, the variable resistance material VR may rapidly increase in resistance. In the present experiment, a reset current is defined to indicate a current in a period where a variable resistance value in accordance with increase in current rapidly increases and then begins to gradually change.

For example, the reset current of Example 4 may be about 347 μA. The reset current of Example 5 may be about 206 μA. The reset current of Example 6 may be about 183 μA. The reset current of Example 7 may be about 217 μA. In summary, Example 6 may have a minimum reset current and may thus have the lowest power consumption.

FIG. 7 is a graph showing an I-V graph of Example 6.

In FIG. 7, the X axis denotes a read voltage, and the Y axis denotes a read current in accordance with the read voltage. In the present experiment, the variable resistance material VR may be provided with the read voltage to measure a current that flows through the variable resistance material VR, thereby measuring a reset threshold voltage and a set threshold voltage. In the present experiment, each of the reset threshold voltage and the set threshold voltage may be measured to calculate a sensing margin of Example 6.

Symbol L1 (dark squares) may indicate I-V characteristics when the variable resistance material VR is in a set state (or a crystalline state). In L1, when the read voltage is greater than about 0.15 V, the read current may have a relatively rapidly increased value. Therefore, the set threshold voltage at L1 may be about 0.15 V.

Symbol L2 (white circles) may indicate I-V characteristics when the variable resistance material VR is in a set state (or a crystalline state). In L2, when the read voltage is greater than 1.45 V, the read current may have a relatively rapidly increased value. Therefore, the set threshold voltage at L2 may be about 1.45 V.

According to the experimental results discussed above, Example 6 may have a sensing margin of about 1.3 V. The same method may be used to measure a sensing margin of each of Examples 4, 5, and 7. Example 4 may have a sensing margin of about 1.05 V, Example 5 may have a sensing margin of about 0.95 V, and Example 7 may have a sensing margin of about 1.03 V. In summary, the variable resistance material VR of Example 6 may have a maximum sensing margin, and thus may have superior read characteristics among the noted Examples.

FIG. 8 is a graph showing a resistance of the variable resistance material VR in accordance with an operation cycle of Example 6.

A used herein, the phrase "an operation cycle is performed once" may mean that the variable resistance material VR changes back to its initial state through a single set operation and a single reset operation. The initial state may be a reset state or a set state. For example, when the initial state of the variable resistance material VR is a reset state, and when one set operation and one reset operation are sequentially executed, the operation cycle may be performed once. For example, when the initial state of the variable resistance material VR is a set state, and when one reset operation and one set operation are sequentially executed, the operation cycle may be performed once.

Referring to FIG. 8, a set operation and a reset operation of the variable resistance memory device may be alternately performed, and after each operation, a resistance of the variable resistance material VR may be measured. In FIG. 8, symbol L3 may indicate a measured set resistance of the variable resistance material VR after the set operation. Symbol L4 may indicate a measured reset resistance of the variable resistance material VR after the reset operation.

For example, when the variable resistance memory device of Example 6 operates at cycles equal to or less than about $2\times10^5$, Example 6 may maintain its reset resistance equal to or greater than about 10 times the set resistance thereof.

For example, when the variable resistance memory devices of Examples 4, 5, and 6 operate at cycles equal to or less than about $9\times10^3$, $5\times10^5$, and $9\times10^3$, respectively, each of Examples 4, 5, and 6 may have a reset resistance that is kept equal to or greater than about 10 times a set resistance thereof.

An increase in difference between the reset resistance and the set resistance of the variable resistance material VR may result in an increase in endurance of the variable resistance material VR. Therefore, the variable resistance material VR of Example 6, among the noted Examples, may have a maximally increased endurance.

According to the disclosure, a variable resistance material including germanium (Ge), antimony (Sb), tellurium (Te), carbon (C), and sulfur (S) and a variable resistance memory device including the same may have improved power consumption and increased read characteristics.

The aforementioned description provides one or more embodiments for explaining the disclosure. However, the disclosure is not limited to the embodiments described above, and it will be understood by one of ordinary skill in the art that variations in form and detail may be made therein without departing from the spirit and essential features of the disclosure.

What is claimed is:

1. A variable resistance memory device comprising:

a first electrode;

a first variable resistance material on the first electrode; and a second electrode on the first variable resistance material, wherein the first variable resistance material comprises germanium (Ge), antimony (Sb), tellurium (Te), carbon (C), and sulfur (S), wherein the first variable resistance material is expressed by $C_pS_qGe_xSb_yTe_z$, where p is an atomic concentration of carbon (C) in the first variable resistance material, q is an atomic concentration of sulfur (S) in the first variable resistance material, x is an atomic concentration of germanium (Ge) in the first variable resistance material, y is an atomic concentration of antimony (Sb) in the first variable resistance material, and z is an atomic concentration of tellurium (Te) in the first variable resistance material, wherein a sum of p, q, x, y, and z equals 1, wherein each of p, q, x, y, and z is greater than zero, and wherein q is greater than 0.01 and is less than or equal to about 0.2.

2. The variable resistance memory device of claim 1, wherein p is greater than 0.03 and is less than or equal to about 0.2.

3. The variable resistance memory device of claim 2, wherein x is equal to or greater than about 0.15 and is less than or equal to about 0.25, and wherein z is equal to or greater than about 0.4 and is less than or equal to about 0.55.

4. The variable resistance memory device of claim 2, wherein a ratio of x, y, and z is substantially 2:2:5.

5. The variable resistance memory device of claim 1, wherein a reset current of the first variable resistance material is less than a reset current of a second variable resistance material, wherein the second variable resistance material comprises germanium (Ge), antimony (Sb), tellurium (Te), and carbon (C), and does not include sulfur (S), wherein a ratio of an atomic concentration of germanium in the second variable resistance material, an atomic concentration of antimony in the second variable resistance material, and an atomic concentration of tellurium in the second variable resistance material is substantially 2:2:5, and wherein an atomic concentration of carbon in the second variable resistance material is substantially the same as p.

6. The variable resistance memory device of claim 5, wherein the second variable resistance material further comprises at least one material selected from B, N, O, Al, P, Ga, As, In, Sn, Sc, Y, Cu, and Ag, and wherein an atomic concentration of the at least one material is substantially the same as q.

7. The variable resistance memory device of claim 5, wherein a sensing margin of the first variable resistance material is greater than a sensing margin of the second variable resistance material.

8. The variable resistance memory device of claim 1, wherein a sensing margin of the first variable resistance material is equal to or greater than about 1.03 V and is less than or equal to about 1.4 V.

9. The variable resistance memory device of claim 1, wherein, based on the variable resistance memory device operating at cycles equal to or less than $2\times10^5$, a reset resistance of the first variable resistance material is equal to or greater than about 10 times a set resistance of the first variable resistance material.

10. The variable resistance memory device of claim 1, further comprising a first barrier pattern on the first variable resistance material, wherein the first barrier pattern is between the first variable resistance material and the second electrode.

11. The variable resistance memory device of claim 1, further comprising:

a selection element between the first electrode and the first variable resistance material; and a third electrode between the selection element and the first variable resistance material.

12. A variable resistance material comprising:

germanium (Ge); antimony (Sb); tellurium (Te); carbon (C); and sulfur (S), wherein the variable resistance material is expressed by $C_pS_qGe_xSb_yTe_z$, where p is an atomic concentration of carbon (C) in the variable resistance material, q is an atomic concentration of sulfur (S) in the variable resistance material, x is an atomic concentration of germanium (Ge) in the variable resistance material, y is an atomic concentration of antimony (Sb) in the variable resistance material, and z is an atomic concentration of tellurium (Te) in the variable resistance material, wherein a sum of p, q, x, y, and z equals 1, wherein each of p, q, x, y, and z is greater than zero, and wherein q is greater than 0.01 and is less than or equal to about 0.2.

13. The variable resistance material of claim 12, wherein p is greater than 0.03 and is less than or equal to about 0.2.

14. The variable resistance material of claim 13, wherein x is equal to or greater than about 0.15 and is less than or equal to about 0.25, and wherein z is equal to or greater than about 0.4 and is less than or equal to about 0.55.

15. The variable resistance material of claim 12, wherein a ratio of x, y, and z is substantially 2:2:5.

16. A variable resistance memory device comprising:

a first electrode;

a first variable resistance material on the first electrode;

a second electrode on the first variable resistance material;

a selection element between the first electrode and the first variable resistance material; and a third electrode between the selection element and the first variable resistance material, wherein the first variable resistance material comprises germanium (Ge), antimony (Sb), tellurium (Te), and sulfur (S), wherein the first variable resistance material is expressed by $S_qGe_xSb_yTe_z$, where q is an atomic concentration of sulfur (S) in the first variable resistance material, x is an atomic concentration of germanium (Ge) in the first variable resistance material, y is an atomic concentration of antimony (Sb) in the first variable resistance material, and z is an atomic concentration of tellurium (Te) in the first variable resistance material, wherein a sum of q, x, y, and z is less than 1, wherein each of q, x, y, and z is greater than zero, and wherein q is greater than 0.01 and is less than or equal to about 0.2.

17. The variable resistance memory device of claim 16, wherein the first variable resistance material further comprises carbon (C), wherein the first variable resistance material is expressed by $C_pS_qGe_xSb_yTe_z$, where p is an atomic concentration of carbon (C) in the first variable resistance material, wherein a sum of p, q, x, y, and z equals 1, and wherein p is greater than 0.03 and is less than or equal to about 0.2.

18. The variable resistance memory device of claim 16, wherein a reset current of the first variable resistance material is less than a reset current of a second variable resistance material, wherein the second variable resistance material comprises germanium (Ge), antimony (Sb), tellurium (Te), and carbon (C), and does not include sulfur (S), and wherein a ratio of an atomic concentration of germanium in the second variable resistance material, an atomic concentration of antimony in the second variable resistance material, and an atomic concentration of tellurium in the second variable resistance material is substantially 2:2:5.

19. The variable resistance memory device of claim 18, wherein the second variable resistance material further comprises at least one material selected from B, N, O, Al, P, Ga, As, In, Sn, Sc, Y, Cu, and Ag, and wherein an atomic concentration of the at least one material substantially the same as q.

20. The variable resistance memory device of claim 18, wherein a sensing margin of the first variable resistance material is greater than a sensing margin of the second variable resistance material.

* * * * *